US008710419B2

(12) United States Patent
Bogaerts

(10) Patent No.: US 8,710,419 B2
(45) Date of Patent: Apr. 29, 2014

(54) HIGH DYNAMIC RANGE PIXEL STRUCTURE

(75) Inventor: Jan Bogaerts, Sint Katelijine Waver (BE)

(73) Assignee: Cmosis NV, Antwerp (BE)

( * ) Notice: Subject to any disclaimer, the term of this patent is extended or adjusted under 35 U.S.C. 154(b) by 260 days.

(21) Appl. No.: 13/362,082

(22) Filed: Jan. 31, 2012

(65) Prior Publication Data

US 2012/0193516 A1 Aug. 2, 2012

(30) Foreign Application Priority Data

Feb. 1, 2011 (GB) .................................. 1101742.3

(51) Int. Cl.
*H01L 27/146* (2006.01)

(52) U.S. Cl.
USPC ......................... 250/208.1; 348/296; 348/294

(58) Field of Classification Search
CPC ................ H01L 27/146; H01L 5/3745; H01L 27/14643; H01L 27/14603; H01L 27/14689
USPC ................................ 250/208.1; 348/294, 296
See application file for complete search history.

(56) References Cited

U.S. PATENT DOCUMENTS

| | | | |
|---|---|---|---|
| 6,087,686 A | 7/2000 | Fox et al. | |
| 2004/0051801 A1 | 3/2004 | Iizuka et al. | |
| 2008/0237446 A1 | 10/2008 | Oshikubo et al. | |
| 2009/0251582 A1 | 10/2009 | Oike | |
| 2011/0019045 A1* | 1/2011 | Lin | 348/296 |
| 2011/0121162 A1* | 5/2011 | Murata et al. | 250/208.1 |

FOREIGN PATENT DOCUMENTS

| | | | |
|---|---|---|---|
| EP | 2107610 | A2 | 10/2009 |
| EP | 2 175 639 | A2 | 4/2010 |
| JP | 2007-150008 | A | 6/2007 |
| JP | 2010268079 | A | 11/2010 |
| WO | 2010013417 | A1 | 2/2010 |

OTHER PUBLICATIONS

Search Report of Belgium Patent Office regarding BE 2012/0059, Apr. 12, 2012.
Search Report of British IP office relating to British Patent Application No. 1101742.3, May 17, 2011.

* cited by examiner

*Primary Examiner* — Tony Ko
(74) *Attorney, Agent, or Firm* — Bacon & Thomas, PLLC

(57) ABSTRACT

A pixel structure comprises a photo-sensitive element PPD for generating charges in response to light and a charge conversion element FD. A first transfer gate TX is connected between the photo-sensitive element PPD and the charge conversion element. A charge storage element PG is connected to the photo-sensitive element PPD. The charge storage element PG has a higher charge storage density than the photo-sensitive element PPD. The charge storage element PG is located on the photo-sensitive element PPD side of the first transfer gate TX and is arranged to collect charges generated by the photo-sensitive element PPD during an integration period. The charge storage element can be a photo gate, photodiode or capacitor. Arrangements are provided with, and without, a potential barrier between the photo-sensitive element PPD and the charge storage element PG.

18 Claims, 19 Drawing Sheets

HIGH DYNAMIC RANGE PIXEL STRUCTURE

FIELD OF THE INVENTION

This invention relates to pixel structures and to arrays of pixel structures which can be used in applications such as image sensors.

BACKGROUND TO THE INVENTION

A pixel structure comprises a photo-sensitive element which is responsive to light. The photo-sensitive element can be a pinned photodiode (PPD). FIG. 1 shows a schematic of a four transistor (4T) pixel structure with a pinned photodiode. The pixel is controlled via reset, transfer and row select switches. The photo-sensitive element generates photo-charges in response to incident light. Before readout of the photo-charge, the floating diffusion (FD) is reset through the reset switch. This reset level is read out through the source follower and selection transistor to the column bus. Then, the charges accumulated into the photodiode are transferred through the transfer transistor to the floating diffusion FD. The signal level is again read out through the source follower and selection transistor.

An advantage of the pinned photodiode is that photo-induced charges (photo-charges) are collected during the integration time and that the charges can then be transferred to the floating diffusion FD during readout. This allows a read out technique called correlated double sampling (CDS) that eliminates kTC reset noise from the FD capacitor. Additionally, the buried nature of the pinned photodiode results in low dark current.

However, pinned photodiodes have some disadvantages. A disadvantage of the pinned photodiode is that it has a more restricted dynamic range compared to a conventional photodiode, such as an n-well/p-substrate junction in a three transistor (3T) pixel. The dynamic range is the range, typically expressed as a ratio, between the largest intensity value that can be resolved by the pixel and the smallest intensity value that can be resolved by the pixel. This disadvantage is particularly problematic when pixel size is reduced.

A paper "4.5 μm Pixel Pitch 154 ke—Full Well Capacity CMOS Image Sensor" and US 2008/0237446A1 describe a pixel which resembles a 4T PPD pixel, but with an additional overflow capacitor, called a Lateral Overflow Integration Capacitor (LOFIC), and a switch which connects the LOFIC to the floating diffusion. A large signal causes overflow charges to be transferred from a photodiode to the overflow capacitor during integration.

The present invention seeks to provide an alternative way of improving the dynamic range of a pixel structure.

SUMMARY OF THE INVENTION

An aspect of the invention provides a pixel structure comprising a photo-sensitive element for generating charges in response to light and a charge conversion element. A first transfer gate is connected between the photo-sensitive element and the charge conversion element. A charge storage element is connected to the photo-sensitive element. The charge storage element has a higher charge storage density than the photo-sensitive element. The charge storage element is located on the photo-sensitive element side of the first transfer gate and is arranged to collect charges generated by the photo-sensitive element during an integration period.

Charges (photo charges) are generated in response to incident light during an integration period. The charge storage element provides an additional charge storage region for the charges, thereby increasing the ability of the pixel to resolve a wider brightness range and hence increasing the dynamic range of the pixel. Collecting the generated charges on the photo-sensitive element side of the first transfer gate allows the pixel to provide good performance in various operating modes, such as a rolling shutter operating mode and a global pipelined shutter operating mode. Charges stored on the charge storage element are read out after the integration period. The charge storage element contributes to a signal value read from the pixel.

Advantageously, a charge storage density of the charge storage element is at least twice a charge storage density of the photo-sensitive element. More advantageously, a charge storage density of the charge storage element is at least five times a charge storage density of the photo-sensitive element. Even more advantageously, a charge storage density of the charge storage element is at least ten times a charge storage density of the photo-sensitive element.

In some of the pixel structures, a photo-sensitive element is used as a charge storage element. However, the charge storage element does not have to be sensitive to light as there is no need for direct collection of photo-generated charges by this element. Typically, the charge storage element receives charges from the photo-sensitive element (e.g. PPD) when needed because of the limited charge storage capability of the photo-sensitive element (e.g. PPD). Advantageously, a major part of the pixel is used for the photo-sensitive element (e.g. PPD) and a lesser part of the pixel is used for the charge storage element to fulfil dynamic range requirements.

Advantageously, the pixel structure further comprises a controller for controlling operation of the pixel structure. The controller is arranged to cause the pixel structure to collect charges on at least one of the photo-sensitive element and the charge storage element during an integration period. The controller is further arranged to cause the pixel structure to transfer charges to the charge conversion element via the first transfer gate at the end of the integration period.

Advantageously, the controller is arranged to cause the pixel structure to transfer charges collected on the charge storage element to the charge conversion element via the photo-sensitive element and the first transfer gate at the end of the integration period.

Improvements offered by embodiments of the present invention are particularly advantageous for small pixel structures.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
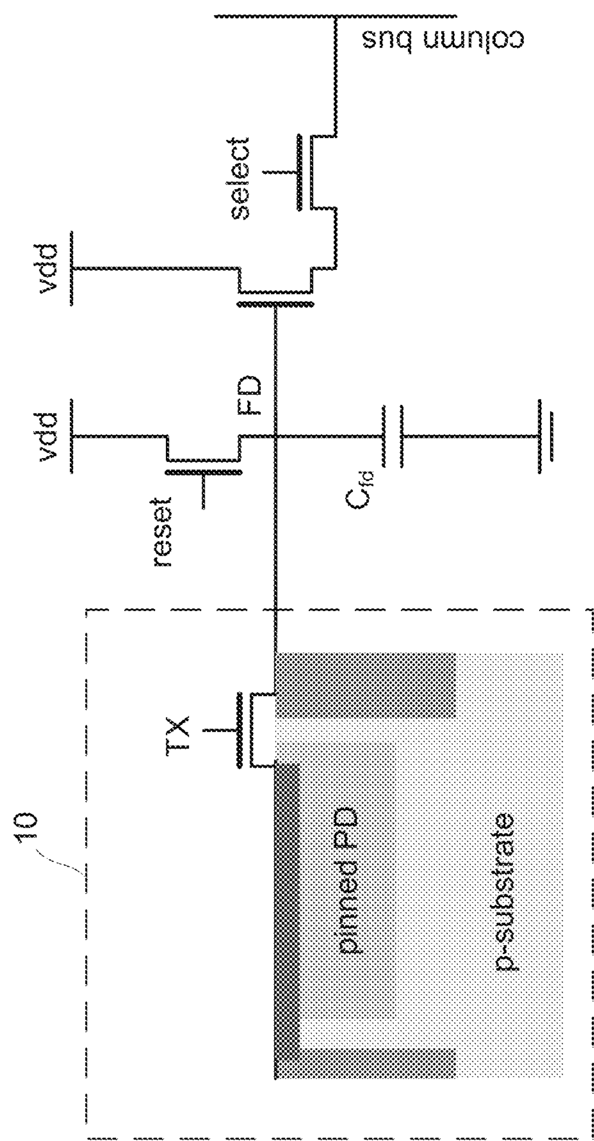
FIG. 1 shows a conventional four transistor (4T) pixel with a pinned photodiode.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms "horizontal" and "vertical" are used in this specification to differentiate two orthogonal directions and do not imply any particular orientation of the array.

Various embodiments will now be described.

PPD Combined with PG

Figure 2A:
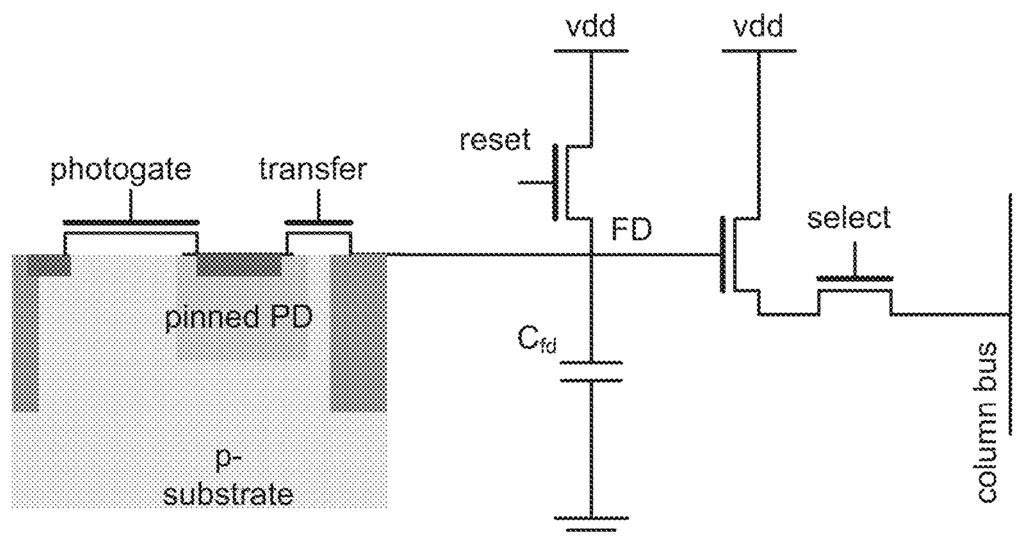
FIGS. 2A-2C show a front end of a pixel structure using a pinned photodiode and a photogate according to an embodiment of the present invention and a sequence of potential diagrams during operation of the pixel.
Figure 2B:
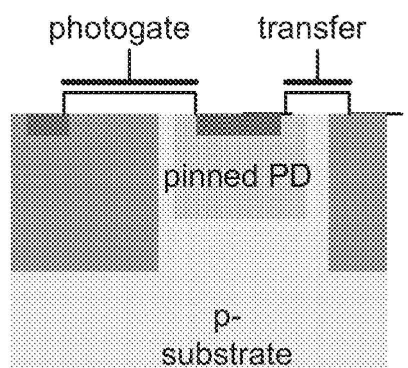
Figure 2C:
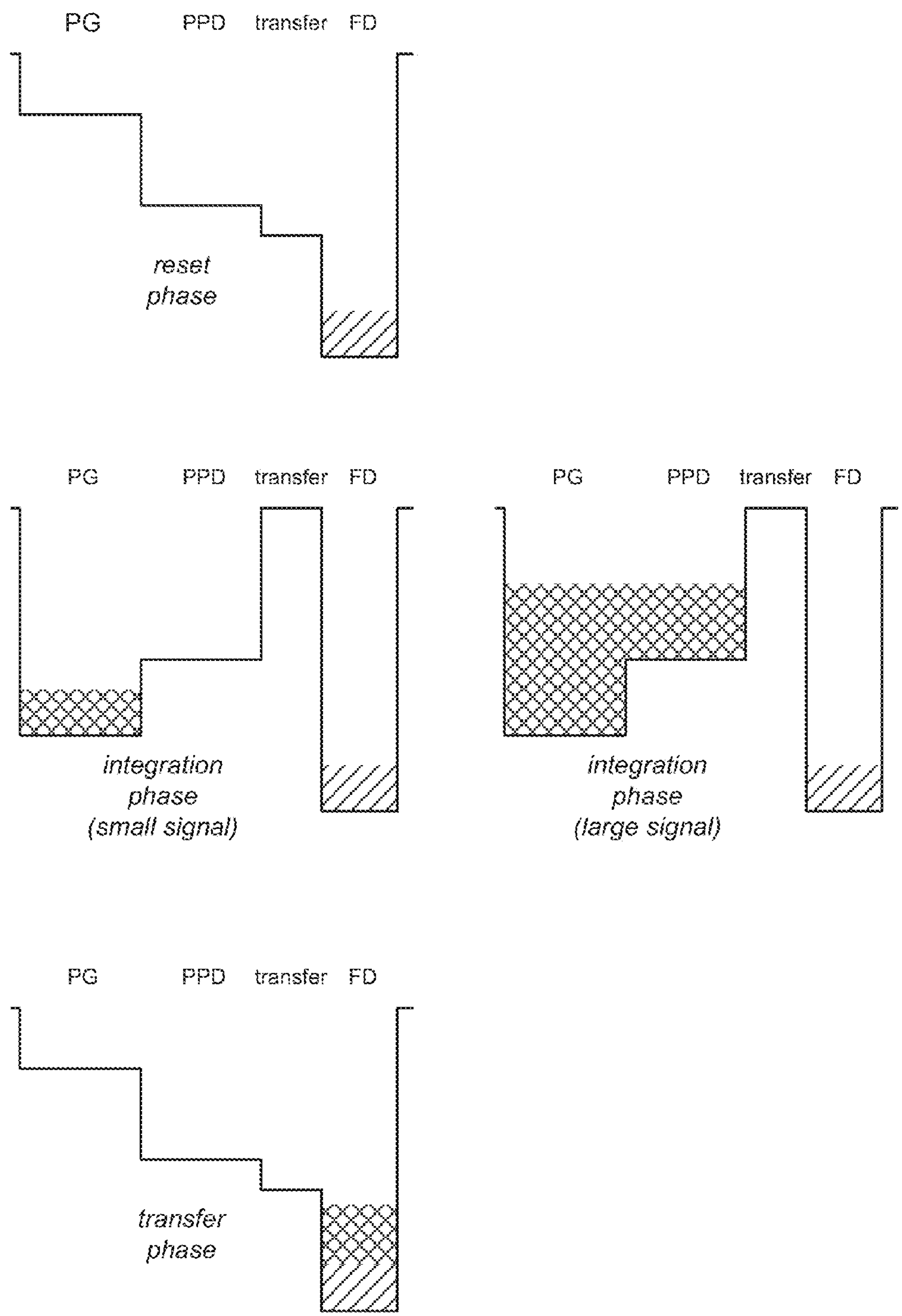

A pinned photodiode (PPD) is combined with a photogate (PG). Pixel structures are shown in FIGS. 2A and 2B. A sequence of potential diagrams during operation of the pixel is shown in FIG. 2C. The combination shown in FIG. 2A or 2B is used in place of the combination 10 of the PPD and transfer gate shown in FIG. 1. FIG. 2A shows one of the simplest topologies for the read out part of the pixel. The read-out part of the pixel can have many different topologies and is not limited to the one shown in FIG. 2A.

Figure 3:
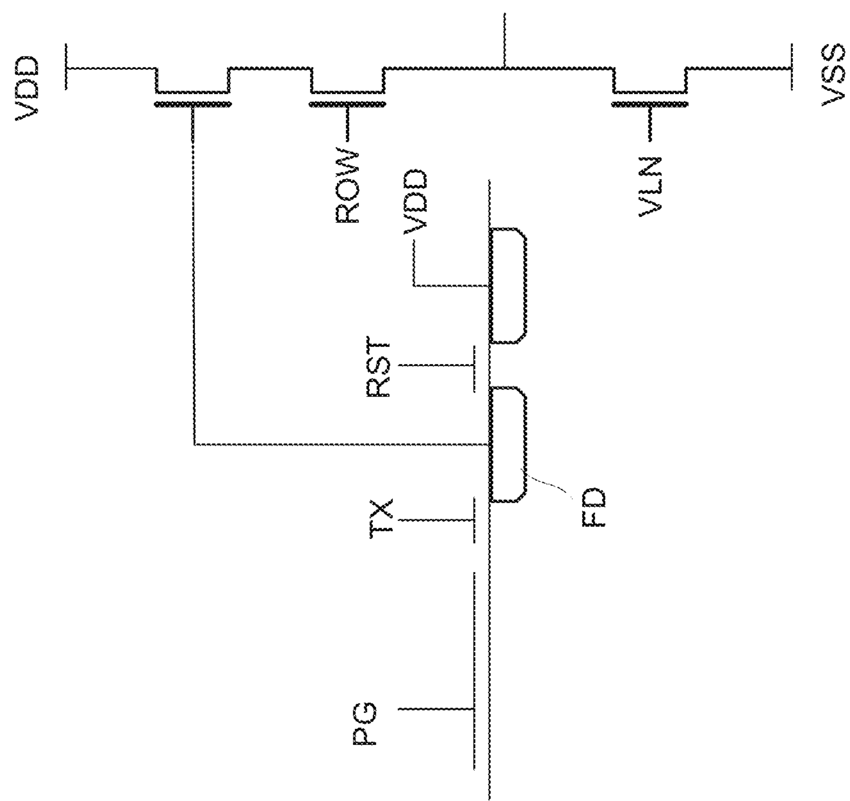
FIG. 3 shows a conventional pixel using a photogate.

By way of background, FIG. 3 shows a conventional schematic of a pixel using a photogate PG. During the integration time, charges are collected underneath the PG (similar to collection in PPD). Charges are transferred during readout to the FD. As in a PPD pixel, the kTC reset noise is eliminated by CDS. Since the gate forms a MOS capacitor and can be pulsed at higher voltages, the density of charge handling capacity is higher than PPD. Disadvantages of the PG structure are that it partially absorbs the light (especially for short wavelengths) and that dark current is typically worse than PPD. For full charge transfer the PG/TX requires closely spaced gates which are not available in standard CMOS processing. It therefore requires modified processing to avoid potential barriers or pockets and lag problems. Because of these disadvantages, this type of pixel structure is now only marginally used in the image sensor industry and the PPD structure is preferred.

FIG. 2C shows a sequence of potential diagrams during operation of the pixel. In each potential diagram, potential increases in the downwards direction of the diagram. An operating cycle for the pixel comprises the steps (phases): reset, integration (also called exposure) and transfer. The terms "exposure" and "integration" are used interchangeably throughout this specification. During the reset and transfer phases, the photogate signal is pulsed low. During integration, the photogate signal is high and photo-charges are collected both underneath the PG (low and high signal levels) and PPD (high signal levels). During the transfer phase, charges stored underneath the PG or in the PPD are transferred completely to the FD. FIG. 2C shows the integration phase for a small signal (i.e. low incident light) and a large signal (i.e. bright incident light). In FIG. 2C a small signal is stored just on the PG. A large signal is stored on a combination of the PG and PPD.

FIG. 2C shows a higher potential underneath the PG compared to the PPD. If the potential under the PG is lower compared to the PPD then the operation will be reversed. A small signal is stored just on the PPD and a large signal is stored on a combination of the PG and PPD.

Charges are not transferred to the FD until the transfer gate is operated. This arrangement combines the good characteristics of both PPD and PG without inheriting most of their drawbacks. The PG provides a higher charge density storage region, without the need for closely spaced gates (as required in the PG only pixel of FIG. 3) and without reduction of short wavelength sensitivity (with conservation of Modulation Transfer Function (MTF)) due to PPD. To explain the issue of closely spaced gates, refer again to the PG only pixel of FIG. 3. The PG and TX gate are next to each other to enable good charge transfer from charges underneath PG towards TX (like in CCD). It requires non-standard CMOS processing. In such case, one needs to make sure that there is no barrier in between the gates, or that there is no pocket created (where charges can become trapped) and that there is sufficient fringing field during transfer to fasten the transfer. In FIGS. 2A-2C the TX gate is not directly next to PG but next to PPD, as in a PPD only pixel. Charges underneath PG are transferred via PPD without the need for closely spaced gates.

The PG can be designed to be only a small fraction of the pixel area to fulfill the full well charge (FWC) specification and minimize its dark current contribution while good MTF is preserved due to the presence of PPD.

The term "pinned" in "pinned photodiode" strictly means that the surface potential of the photodiode is pinned to substrate potential (because of p+ type implant on top of photodiode connected to the substrate). More generally, it is understood that such diode is also fully depletable. When charges are transferred, the photodiode is completely emptied of free minority charges. At that moment, its potential is also 'pinned' to a maximum Vpin.

With respect to charge density, a pinned photodiode (PPD) can typically have a charge density of 1 to 5 Ke/um$^2$ (1000-5000 electrons per square micron). A gate capacitance is typically of the order of a few fF/um$^2$ (typically 5-7 fF/um$^2$). 1 fF can store 6250 electrons over 1V, meaning that a gate capacitance of 5-7 fF/um$^2$ can store more than 30 Ke-/um$^2$ over 1 Volt. Other values of charge density are possible in the PPD and PG. The charge storage density of the charge storage element can be at least five times a charge storage density of the photo-sensitive element, and can be an order of magnitude higher than a charge storage density of the photo-sensitive element.

PPD Combined with PD

Figure 4A:
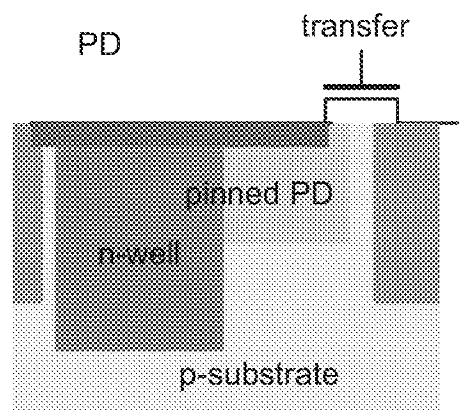
FIGS. 4A-4C show a front end of a pixel structure using a pinned photodiode and a photodiode according to an embodiment of the present invention and a sequence of potential diagrams during operation of the pixel.
Figure 4B:
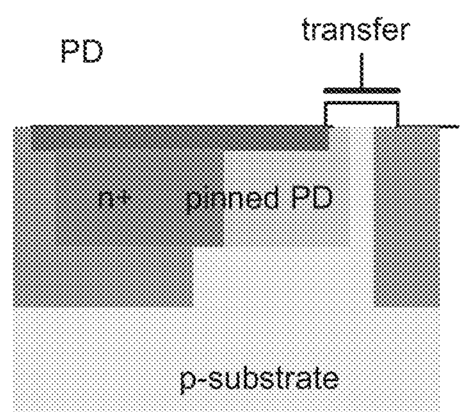
Figure 4C:
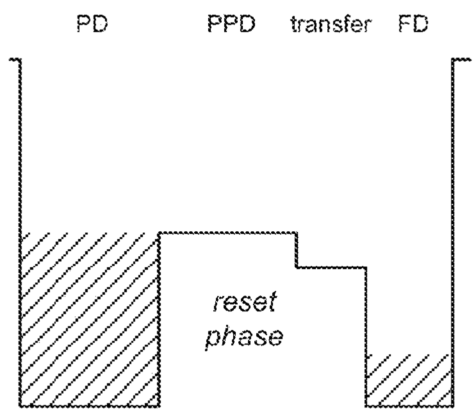
Figure 4C:
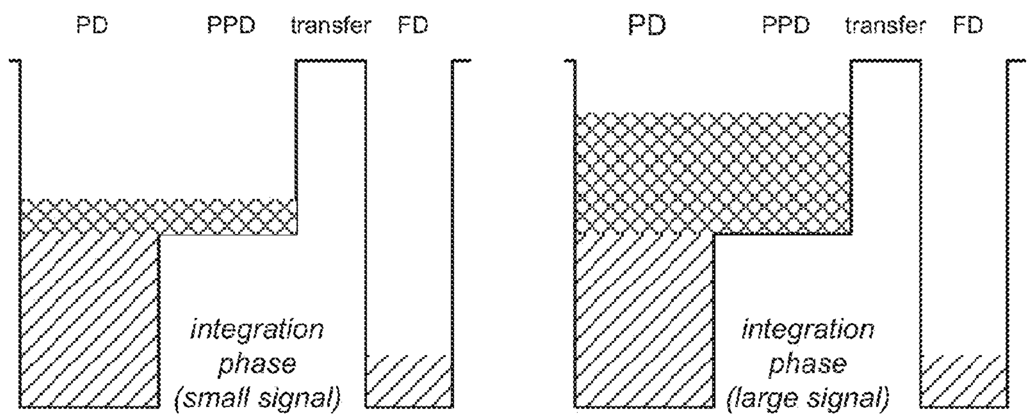
Figure 4C:
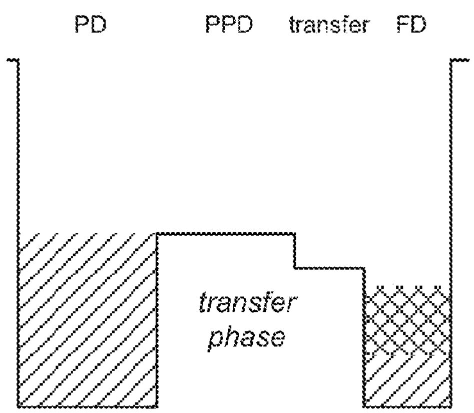

A pinned photodiode (PPD) is combined with a photodiode (PD). The photodiode can be a second pinned photodiode which is not fully depletable). Pixel structures are shown in FIGS. 4A and 4B. A sequence of potential diagrams during operation of the pixel is shown in FIG. 4C. The combination shown in FIG. 4A or 4B is used in place of the combination 10 of the PPD and transfer gate shown in FIG. 1.

Referring to FIG. 4C, during reset and transfer phases, the photodiode is reset through PPD. Charges stored in the PPD are transferred completely to the FD. During integration, the photo-charges are collected both in the PD and PPD (low and high signal levels). The combination brings a similar advantage as PPD combined with PG, but is simpler in design and requires no additional control line. The reset of the PD through PPD can introduce some image lag and associated noise. However, this will be less than in 3T pixel with soft reset. The image lag can also be eliminated by a hard to soft reset of the PD by control through FD.

PPD Combined with Lateral Overflow Barrier (LOB) and PG

Figure 5A:
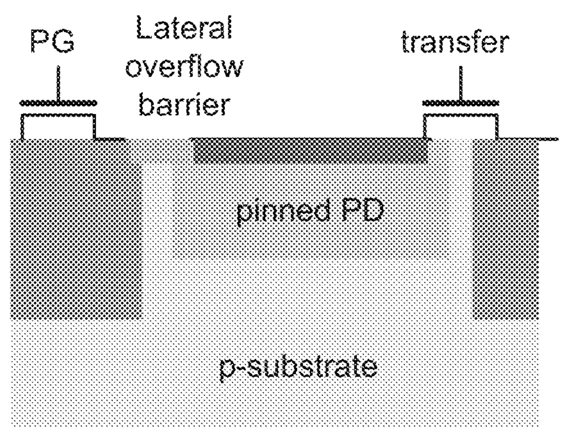
FIGS. 5A and 5B show a front end of a pixel structure using a pinned photodiode, a lateral overflow barrier and a photogate according to an embodiment of the present invention and a sequence of potential diagrams during operation of the pixel.
Figure 5B:
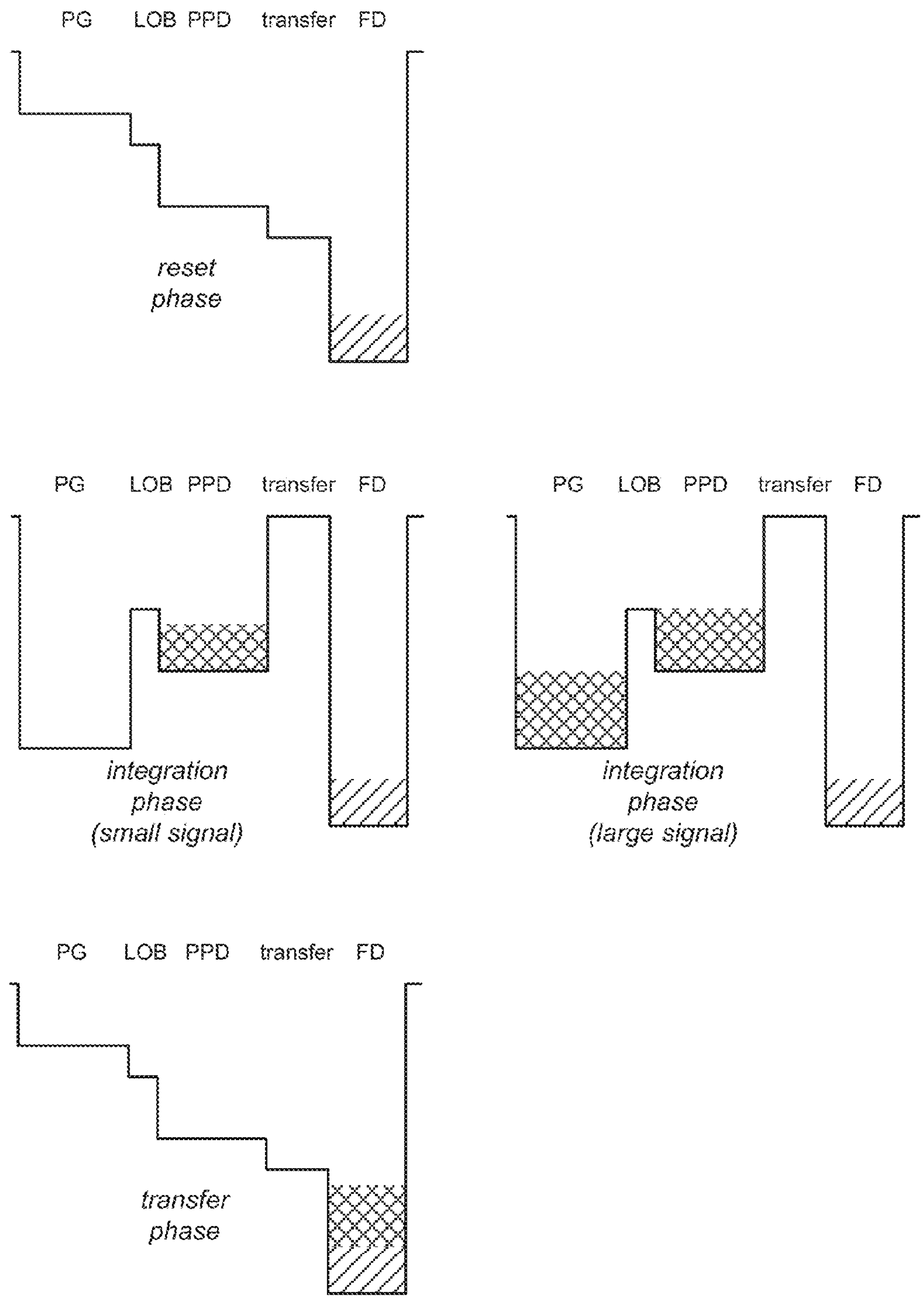

A pinned photodiode (PPD) is combined with a lateral overflow barrier (LOB) and a PG. The pixel structure is shown in FIG. 5A. A sequence of potential diagrams during operation of the pixel is shown in FIG. 5B. The combination shown in FIG. 5A is used in place of the combination 10 of the PPD and transfer gate shown in FIG. 1. A DC gate can be used in place of the LOB, and has a similar effect as the LOB.

The lateral overflow barrier (LOB) is a region with a fixed potential. During reset or transfer phase, the PG (pulsed low) is reset through PPD. Charges stored in PG and the PPD are transferred completely to the FD. During integration, PG is pulsed high and the photo-charges are collected in PPD (for low signals) and in the PG (high signal levels). The combination brings again a similar advantage as PPD combined with PG, but has the additional advantage that for low signals the photo-charges are collected in PPD only. In case the photo-charges are readout sequentially (first transfer without pulsing PG low), only the charges collected in PPD are transferred. On this signal, only dark current from PPD is added. For the high signals (after pulsing PG low) dark current from both PPD and PG is added.

A DC gate can be used in place of the LOB. A DC gate is a TX gate with the control signal of the gate tied to a DC signal. A region with fixed potential is created.

PPD Combined with Lateral Overflow Barrier (LOB) and Capacitor

Figure 6A:
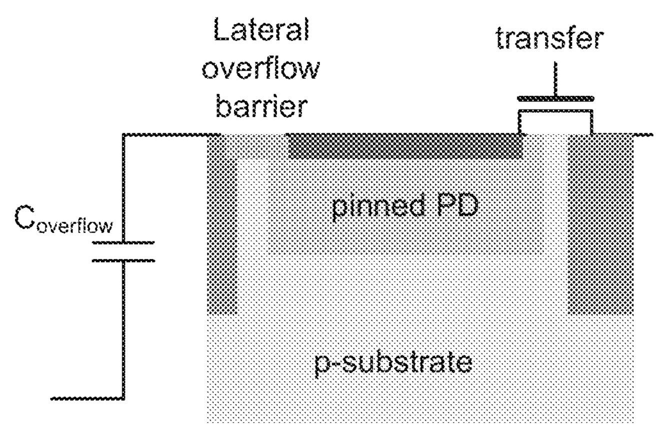
FIGS. 6A and 6B show a front end of a pixel structure using a pinned photodiode, a lateral overflow barrier and a capacitor according to an embodiment of the present invention and a sequence of potential diagrams during operation of the pixel.
Figure 6B:
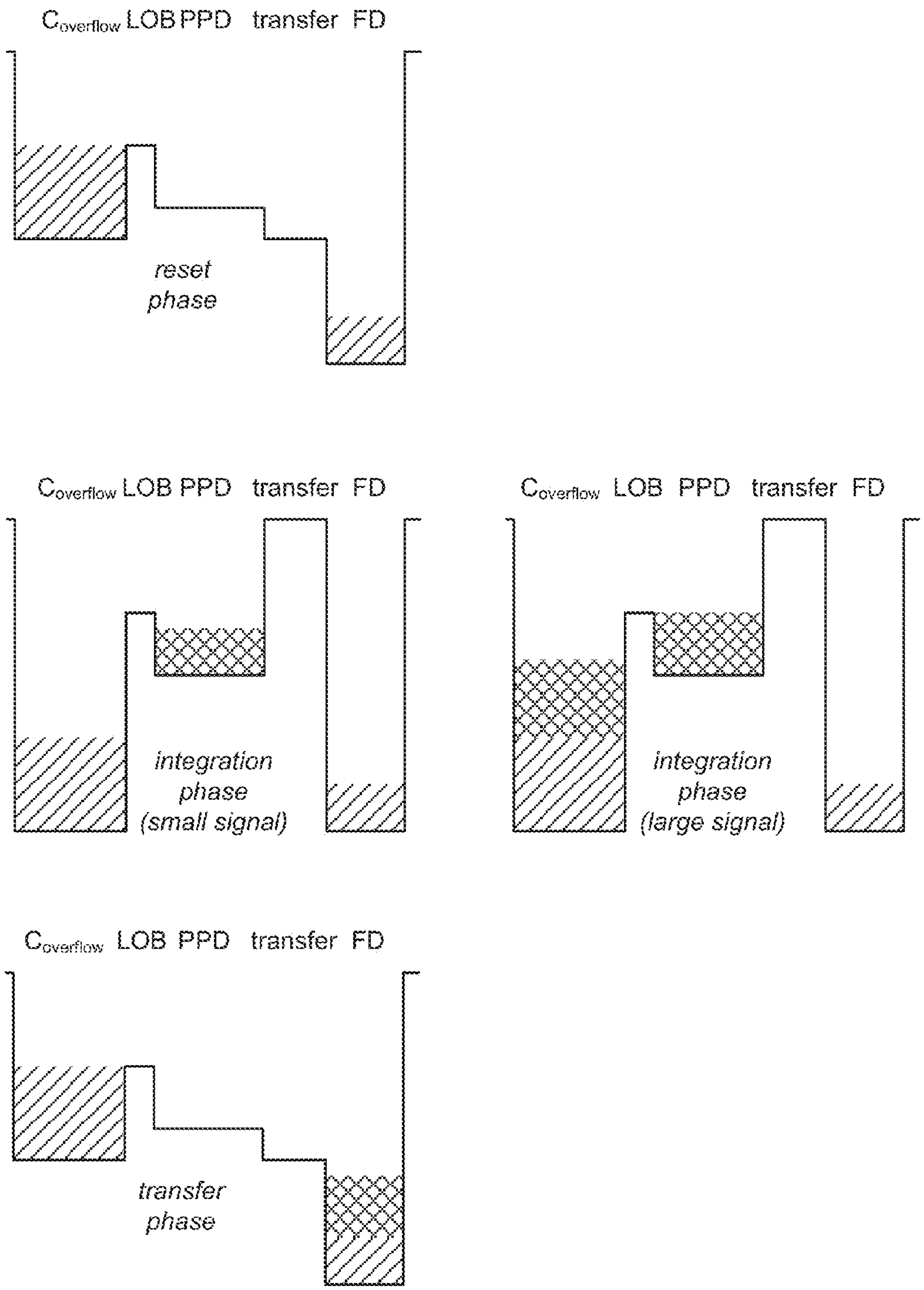

A pinned photodiode (PPD) is combined with a lateral overflow barrier (LOB) and a capacitor $C_{overflow}$. The pixel structure is shown in FIG. 6A. A sequence of potential diagrams during operation of the pixel is shown in FIG. 6B. The combination shown in FIG. 6A is used in place of the combination 10 of the PPD and transfer gate shown in FIG. 1. A DC gate can be used in place of the LOB, and has a similar effect as the LOB.

The capacitor can be of different type but must support pulsed operation (first terminal connected to junction next to LOB, second terminal connected to control signal that is pulsed). The lateral overflow barrier is a region with a fixed potential. During reset or transfer phase, the second terminal of the capacitor is pulsed high. Charges stored in the PPD are transferred completely to the FD, the charges in the overflow capacitor partially. During integration, the second terminal of the capacitor is pulsed low and the photo-charges are collected in PPD (for low signals) and in $C_{overflow}$ (high signal levels). The combination is similar to the combination of PPD and LOB and PG, but does not have the ability of full charge transfer. The capacitor can be realised, for example, as Metal-insulator-Metal (MiM or MoM), Poly-insulator-poly (PiP), MOS cap (more general than PG).

PPD Combined with Transfer Gate (TX) and PG

Figure 7A:
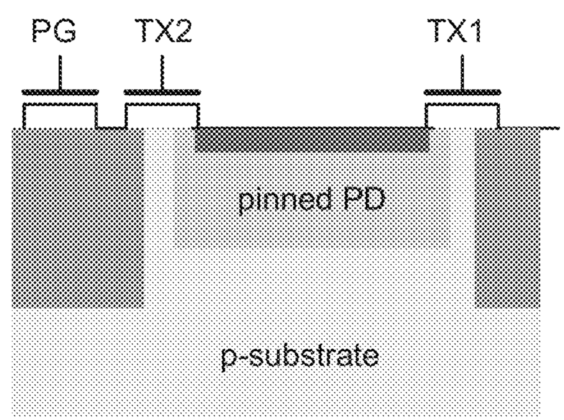
FIGS. 7A and 7B show a front end of a pixel structure using a pinned photodiode, a transfer gate and a photogate according to an embodiment of the present invention and a sequence of potential diagrams during operation of the pixel.
Figure 7B:
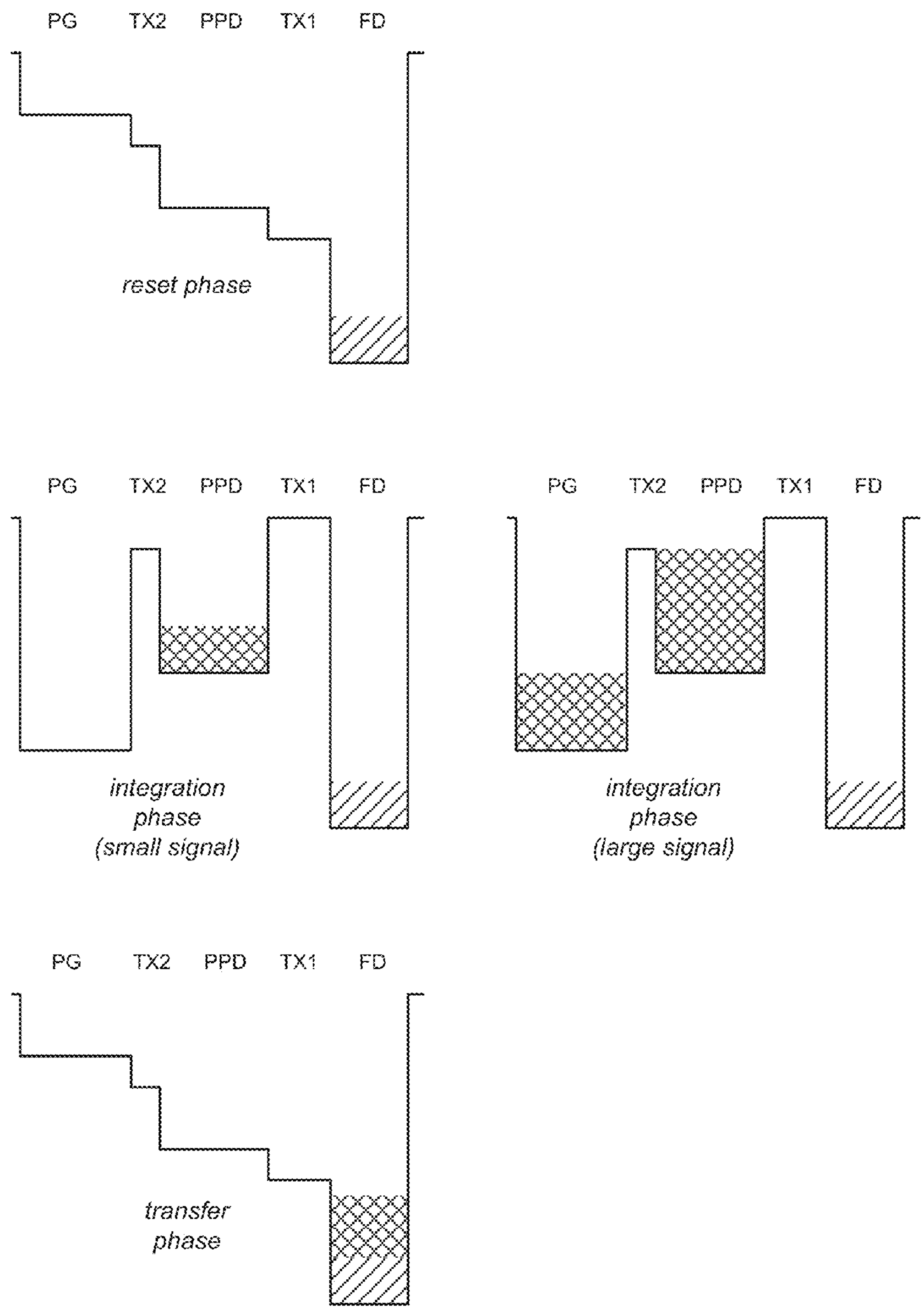

A pinned photodiode (PPD) is combined with a second transfer gate (TX2) and a photogate (PG). The pixel structure is shown in FIG. 7A. A sequence of potential diagrams during operation of the pixel is shown in FIG. 7B. The combination shown in FIG. 7A is used in place of the combination 10 of the PPD and transfer gate shown in FIG. 1. Unlike the case for the lateral overflow barrier in PPD+LOB+PG and PPD+LOB+CAP, the second transfer gate TX2 allows to change the potential for overflow or readout of charges to/from the photogate PG. During the reset and transfer phases, the PG is pulsed low while TX2 is relatively low. Charges stored in the PPD and PG are transferred completely to the FD. During integration, the PG is pulsed high (with TX2 low) and the photo-charges are collected in PPD (for low signals) and in the PG (high signal levels). The combination is similar to PPD+LOB+PG and has the same advantages, but allows more charge collection in PPD since overflow potential can be changed. A drawback is that it needs two closely spaced gates.

PPD Combined with Transfer Gate (TX) and Capacitor (CAP)

Figure 8A:
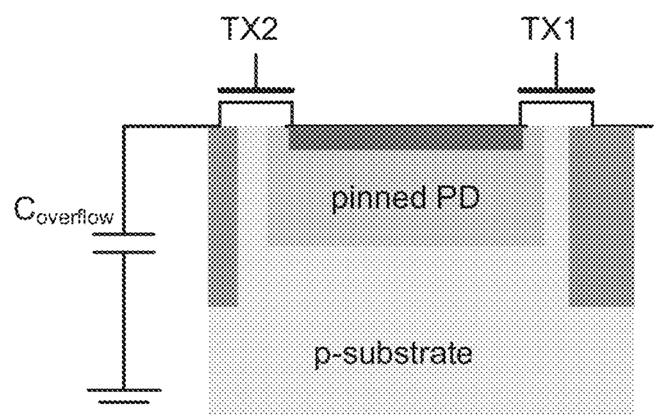
FIGS. 8A and 8B show a front end of a pixel structure using a pinned photodiode, a transfer gate and a capacitor according to an embodiment of the present invention and a sequence of potential diagrams during operation of the pixel.
Figure 8B:
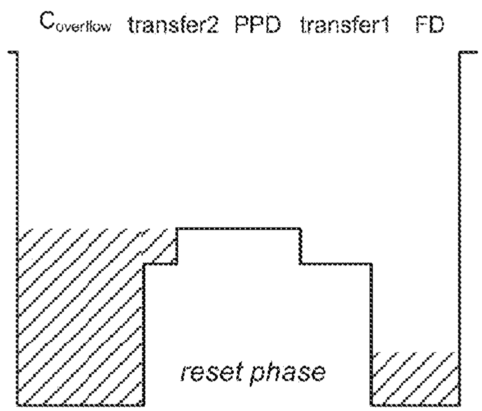
Figure 8B:
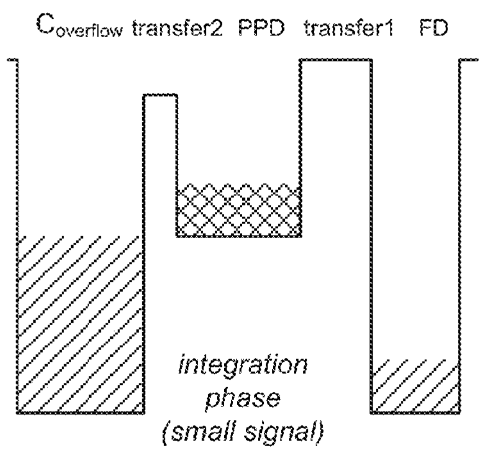
Figure 8B:
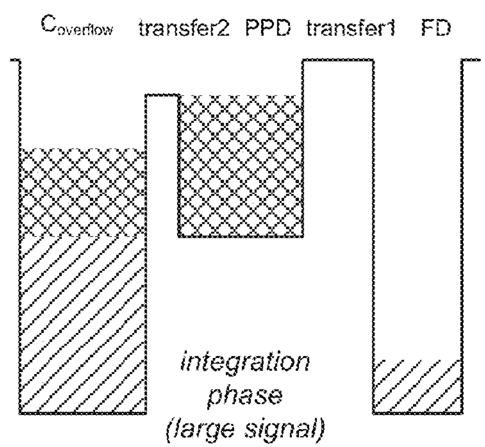
Figure 8B:
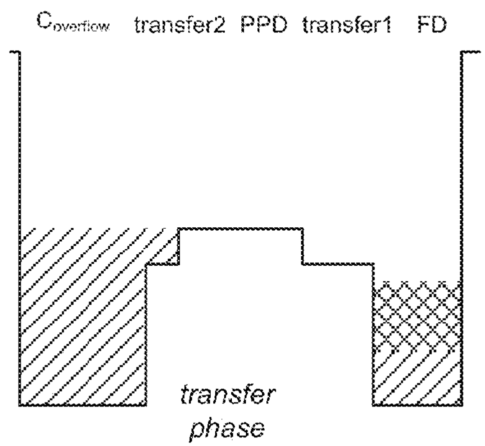

A pinned photodiode (PPD) is combined with a second transfer gate (TX2) and overflow capacitor $C_{overflow}$. The pixel structure is shown in FIG. 8A. A sequence of potential diagrams during operation of the pixel is shown in FIG. 8B. The combination shown in FIG. 8A is used in place of the combination 10 of the PPD and transfer gate shown in FIG. 1.

The capacitor can be of different type. It does not have to support pulsed operation, although pulsed operation can be considered as well. The capacitor can be realised, for example, as Metal-insulator-Metal (MiM or MoM), Poly-insulator-poly (PiP), MOS capacitor. In addition, the capacitor in this embodiment can be realised as a junction capacitance (or PD for example). This is because the potential of the TX2 gate can be changed in this case, whereas it could not be changed in the case of PPD+LOB+Cap where the LOB potential is fixed. The potential difference allows for charges to overflow, so either the potential in the transfer region or storage region (pulsing of one side of capacitor) needs to be changed between integration cycle and reset/transfer cycle (or both potentials).

Unlike the case for the lateral overflow barrier in PPD+LOB+PG and PPD+LOB+CAP, the second transfer gate TX2 allows to change the potential for overflow or readout of charges to/from PG. During reset or transfer phase, the TX2 signal is high (can be pulsed low again to finish transfer/reset). Charges stored in the PPD are transferred completely to the FD, charges in capacitor only partially. During integration, TX2 is low (higher than TX1) and the photo-charges are collected in PPD (for low signals) and in the overflow capacitor (high signal levels). The combination is similar to PPD+TX+PG and has the same advantages. Advantage is that it does not need two closely spaced gates, but a drawback is that charge transfer from overflow capacitor $C_{overflow}$ is not complete (see also PPD+PD).

HDR Rolling Shutter Pixels

The pixel structures described above can be applied to rolling shutter pixels.

HDR Global Pipelined Shutter Pixels

The pixel structures described above can be applied to global pipelined shutter pixels. FIGS. 9A-9F schematically show pixels capable of global shutter operation. In each case, one of the previously described arrangements forms the light-receiving section of the pixel. A full description of the topology of, and operation of, a global shutter pixel is given in European Patent Application EP 2 109 306 A2.

Figure 9A:
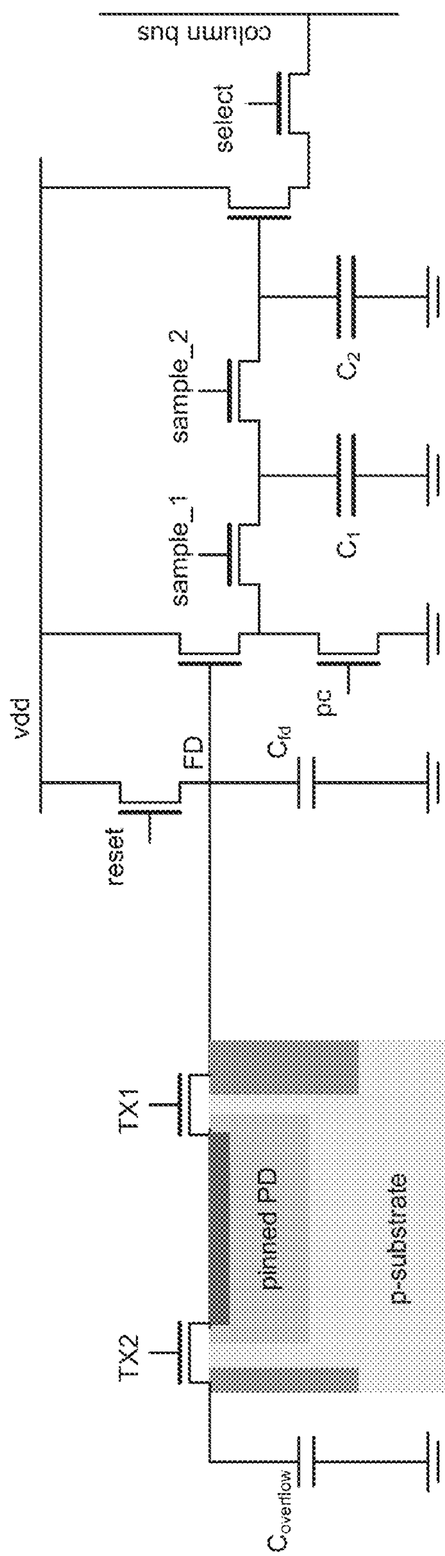
FIGS. 9A to 9F show pixel structures capable of global pipelined shutter operation.
Figure 9B:
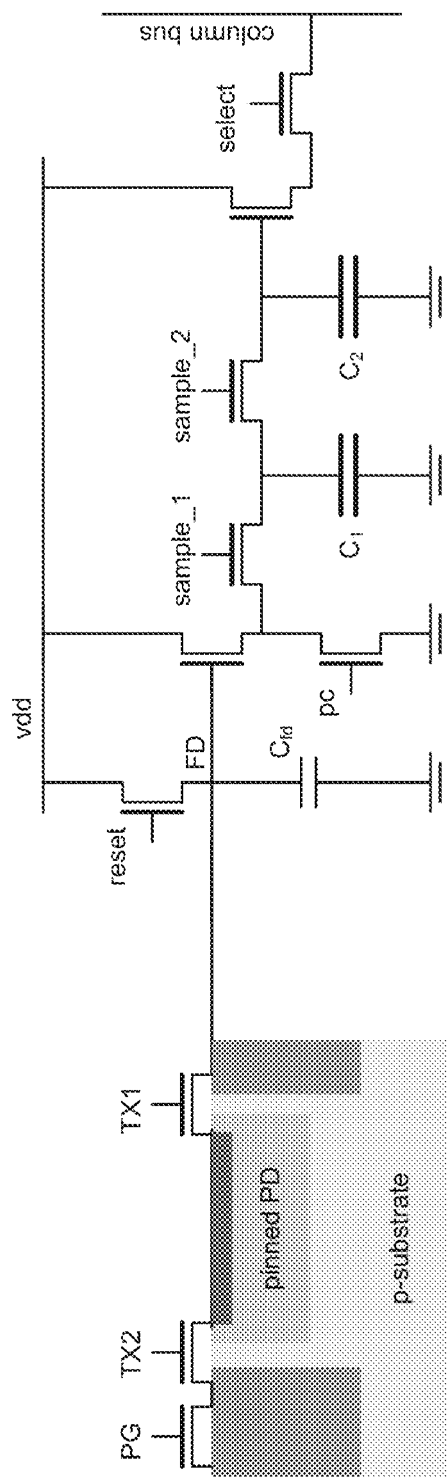
Figure 9C:
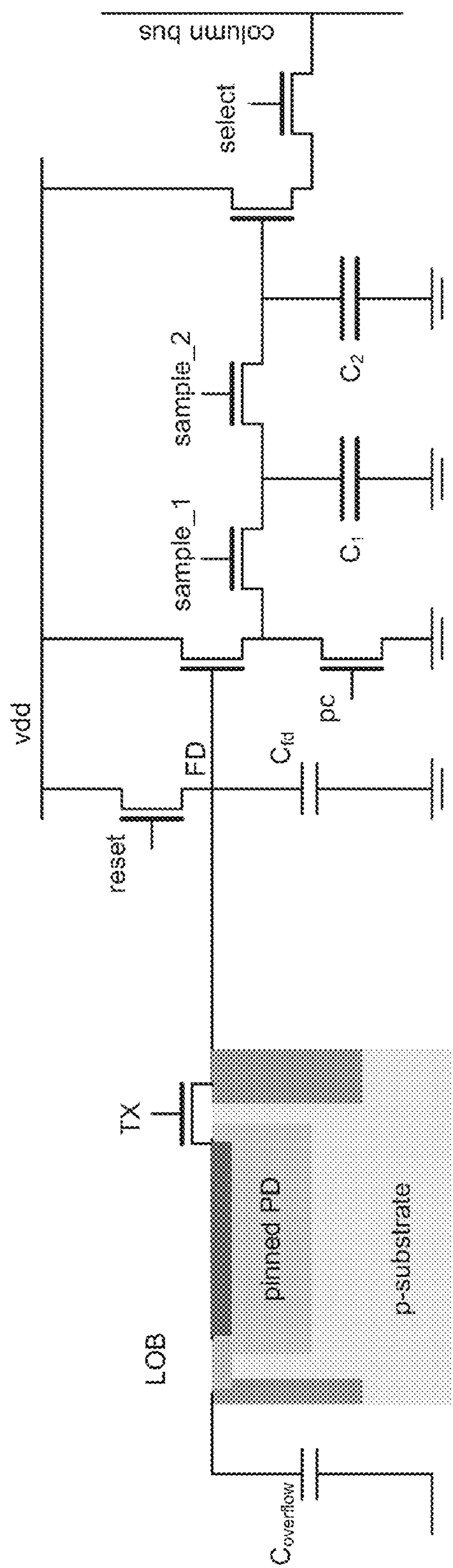

In FIGS. 9A and 9C, overflow capacitor $C_{overflow}$ is reset to Vpin. Vpin is the potential when PPD is empty. By design/processing, the potential cannot become higher in PPD because of its fully depletable nature. $C_{overflow}$ is not fully depletable and is never 'empty'. It always contains charges depending on the voltage externally applied to it. During the reset phase, the shaded area stands for charges filling the capacitor to a level dictated by Vpin (since reset happens through PPD) after reset. Capacitor C1 stores the reset level of the pixel. Capacitor C2 stores the signal level of the pixel after charge transfer to Cfd.

Figure 9D:
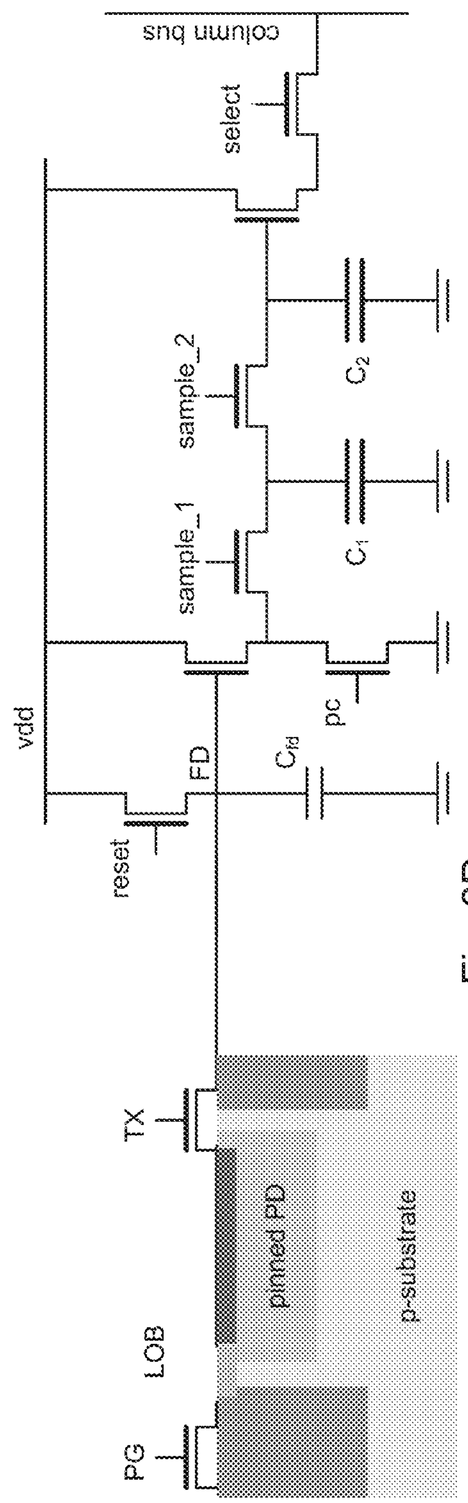
Figure 9E:
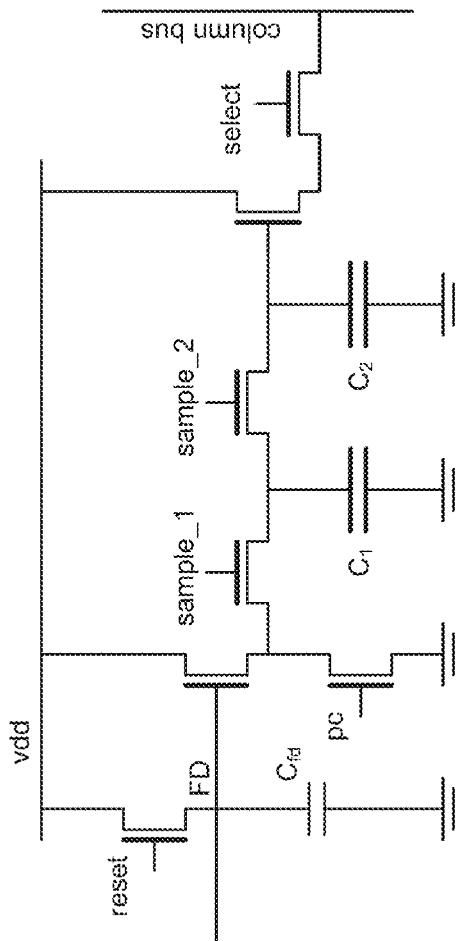
Figure 9E:
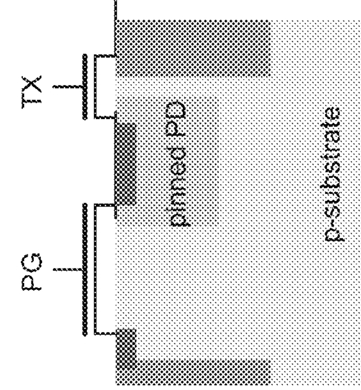

In FIGS. 9B, 9D and 9E the photogate PG is, ideally, fully emptied (low voltage on gate). Otherwise, channel potential is the same as Vpin in photodiode.

The transfer gate TX2 is the overflow gate. This can be pulsed during the Frame Overhead Time (FOT) in FIG. 9A FOT is a term typically used in global shutter sensors and is the period during the frame sequence where the global operation is performed on the pixels. After FOT, signals are read out.

Figure 9F:
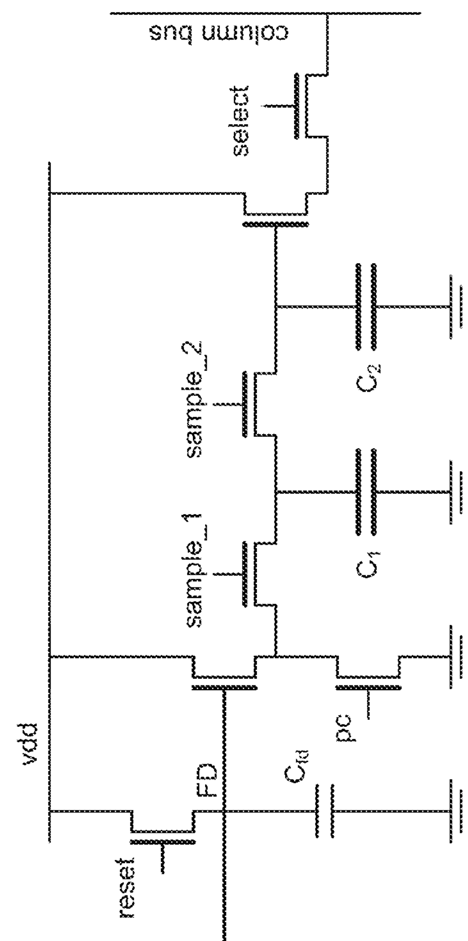
Figure 9F:
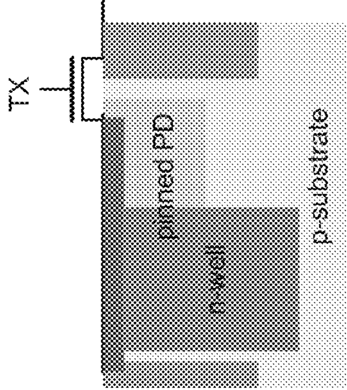

In FIG. 9E and FIG. 9F charges are immediately integrated on photogate/n-well diode (larger charge density as on pinned photodiode). Especially for the latter, this may result in larger dark current and/or read noise.

FIG. 9E the photogate PG can, as an alternative, just be a second transfer gate. It is the charge storing function of the gate which is used.

Figure 10:
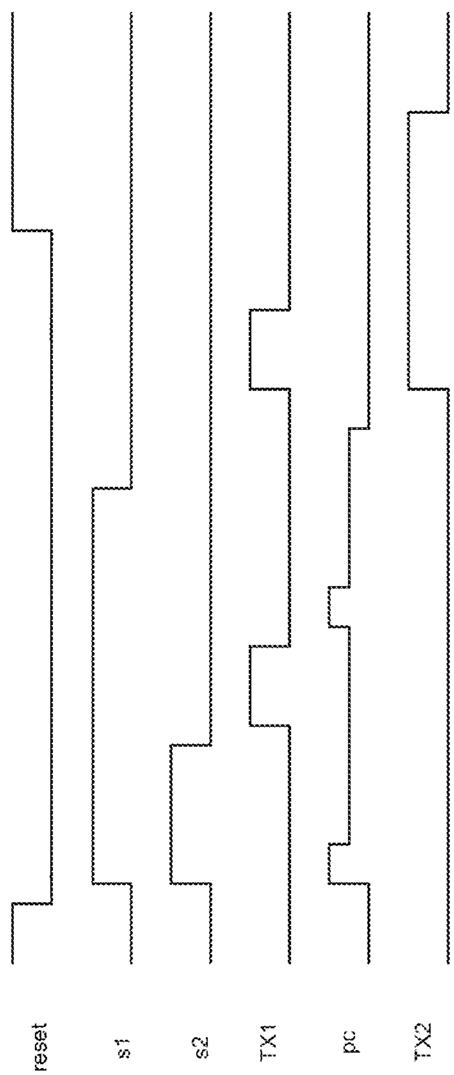
FIGS. 10 and 11 show timing diagrams for FIGS. 9A to 9B FIG. 12 schematically shows a pixel array architecture.
Figure 11:
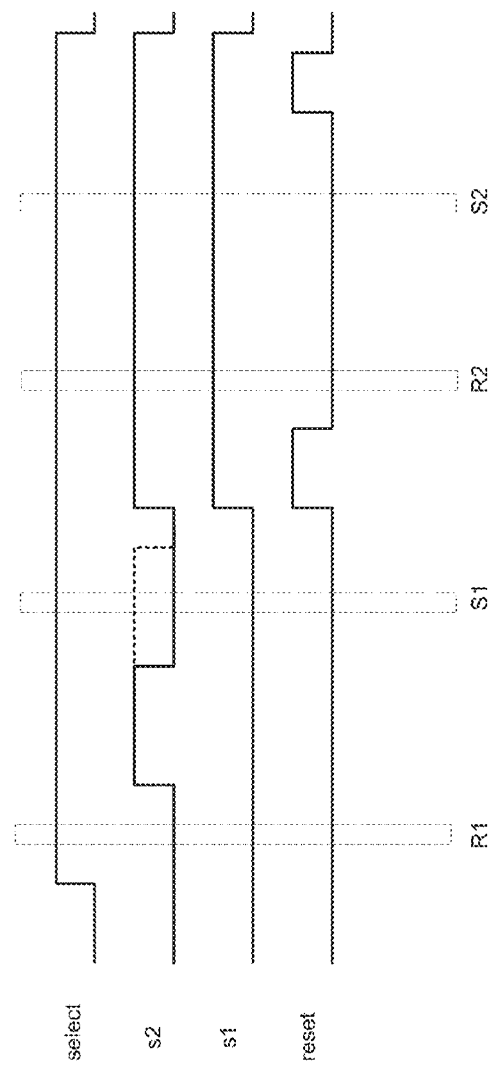

FIG. 10 is an example of the FOT timing sequence. FIG. 11 is an example of single row readout sequence.

During the frame overhead time (FOT), the FD is first released from resetting by switching off the reset transistor. Thus the reset noise is preserved in the floating diffusion. Meanwhile, both sample_1 and sample_2 switches are on and the reset level is sampled on both C1 and C2. After sampling, sample_2 is switched off and the reset level remains stored on C2. Then the photo-generated charges are transferred from the pinned photodiode to the floating diffusion by switching on the TX transistor. Meanwhile, since sample_1 is still on during the complete transfer process, the light signal which is converted in the FD is also sampled on C1. After sampling, the sample1 switch is off so that the light signal is preserved on C1. The pixel is ready for the start of the integration of the next frame. During integration, the FD remains in the reset state, and the transfer gate can act as an antiblooming drain.

During the row overhead time (ROT), the SEL transistor is switched on so that the reset level which is stored on C2 is readout first. Afterwards, the sample_2 is switched on to short C1 and C2. Thus, the photosignal stored on C1 is attenuated by half if C1 equals to C2. Afterwards, the attenuated signal is read out as the light signal. During this process, two operation modes can be realised if sample_2 is off before the end of SEL pulse, C2 will see a complete switching cycle from the sample_2 transistor. If sample 2 is not switched off when reading the photosignal on C1, the KTC noise from the sample_2 transistor is not included in the light signal, which results in a reduced pixel read noise (although an additional offset in introduced).

Figure 12:
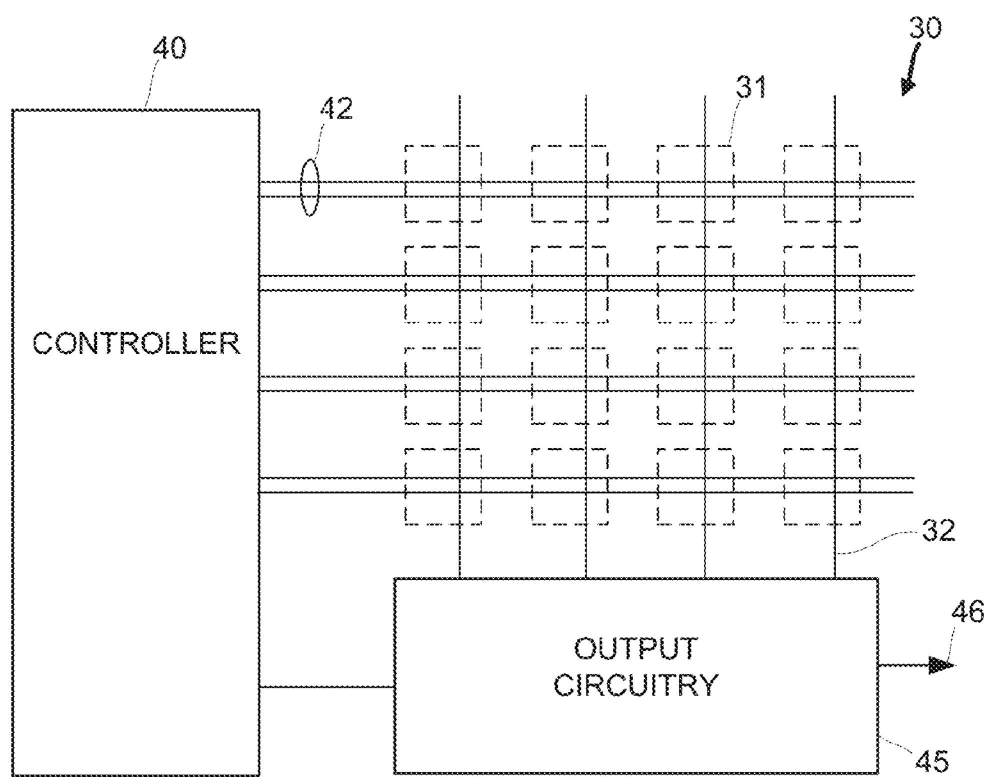

FIG. 12 shows an architecture of a pixel array and associated circuitry. A pixel array 30 comprises an array of individual pixels 31 which can be arranged as a 1D or 2D array. Each pixel 31 can have a form as shown in one of the previous figures, or a variant of one of these. Typically, there is an output bus per line of pixels (typically per column) in the array 30 on to which signal values are selectively output. Output circuitry 45 processes signal values 32 output from each pixel 31 of the array 30. Each pixel can output a single signal value or multiple signal values. If double sampling, or Correlated Double Sampling (CDS), is performed, values representative of reset noise are output 32. The output circuitry 45 shown in FIG. 12 can be shared by all outputs of the pixel array 30 on a time-multiplexed basis. Alternatively, there can be an instance of the output circuitry 45 for each column, or other line of the array 30, to improve data throughput.

Controller 40 controls operation of the pixel array 30 and output circuitry 45. Controller 40 includes row selection/line driver circuitry for generating control signals on control lines 42 to drive pixels 31 in the array 30. Controller 40 controls: resetting of the pixels to control the integration period; operation of the transfer gates TX1, TX2 to transfer charges to the floating diffusion (or multiple floating diffusions); operation of switches reset, select, sample_1, sample_2, to control readout from a pixel. Example timing schemes for the control signals have been shown in FIGS. 10 and 11. The pixel array can be read out in a conventional manner, with pixels being scanned on a row-by-row basis. Controller 40 can perform a global shutter function by synchronising operation of the control signals which control respective integration times of each of the pixels of the array. The control logic of controller 40 can be stored in hard-coded form, such as in an Application Specific Integrated Circuit, or it can be stored in some form of reconfigurable processing apparatus, such as a logic array (programmable array, reconfigurable array) or a general-purpose processor which executes control software. All of the elements shown in FIG. 12 can be provided on a single semiconductor device or the elements can be distributed among several separate devices.

The invention is not limited to the embodiments described herein, which may be modified or varied without departing from the scope of the invention.

The invention claimed is:

1. A pixel structure comprising:

a photo-sensitive element for generating charges in response to light;

a charge conversion element;

a first transfer gate connected between the photo-sensitive element and the charge conversion element;

a charge storage element connected to the photo-sensitive element, the charge storage element having a higher charge storage density than the photo-sensitive element, wherein the charge storage element is located on the photo-sensitive element side of the first transfer gate and is arranged to collect charges generated by the photo-sensitive element during an integration period.

2. The pixel structure according to claim 1, wherein a charge storage density of the charge storage element is at least twice a charge storage density of the photo-sensitive element.

3. The pixel structure according to claim 1, wherein a charge storage density of the charge storage element is at least five times a charge storage density of the photo-sensitive element.

4. The pixel structure according to claim 1, wherein a charge storage density of the charge storage element is at least ten times a charge storage density of the photo-sensitive element.

5. The pixel structure according to claim 1 wherein the photo-sensitive element is a pinned photodiode.

6. The pixel structure according to claim 1, wherein the photo-sensitive element is connected to the charge storage element without an intermediate potential barrier such that, in use, charges are collected across a combination of the charge storage element and the photo-sensitive element.

7. The pixel structure according to claim 1, further comprising a potential barrier between the photo-sensitive element and the charge storage element such that, in use, charges are first collected by the photo-sensitive element and, when the barrier is exceeded, overflow charges are collected by the charge storage element.

8. The pixel structure according to claim 7, wherein the barrier is a fixed potential barrier.

9. The pixel structure according to claim 8, wherein the barrier is one of: a lateral overflow barrier (LOB); a DC gate.

10. The pixel structure according to claim 7, wherein the barrier between the photo-sensitive element and the charge storage element is controllable.

11. The pixel structure according to claim 10, wherein the controllable barrier is a second transfer gate.

12. The pixel structure according to claim 1 further comprising a controller for controlling operation of the pixel structure, wherein the controller is arranged to cause the pixel structure to:

collect charges on at least one of the photo-sensitive element and the charge storage element during an integration period;

transfer charges to the charge conversion element via the first transfer gate at the end of the integration period.

13. The pixel structure according to claim 12 wherein the controller is arranged to cause the pixel structure to transfer charges collected on the charge storage element to the charge conversion element via the photo-sensitive element and the first transfer gate at the end of the integration period.

14. The pixel structure according to claim 1, wherein charge storage capacity of the charge storage element is greater than that of the photo-sensitive element.

15. The pixel structure according to claim 1 wherein the charge storage element is one of: a photogate; a photodiode; a capacitor.

16. The pixel array comprising a plurality of pixel structures according to claim 1.

17. A method of operating a pixel structure comprising a photo-sensitive element for generating charges in response to light, a charge conversion element, a first transfer gate connected between the photo-sensitive element and the charge conversion element and a charge storage element connected to the photo-sensitive element, the method comprising:

generating charges at the photo-sensitive element in response to incident light;

collecting charges on at least one of the photo-sensitive element and the charge storage element during an integration period, wherein the charge storage element has a higher charge storage density than the photo-sensitive element;

transferring charges to the charge conversion element via the first transfer gate at the end of the integration period.

18. The method according to claim 17 further comprising transferring charges collected on the charge storage element to the charge conversion element via the photo-sensitive element and the first transfer gate at the end of the integration period.

* * * * *